US011735658B2

(12) United States Patent
Miao et al.

(10) Patent No.: US 11,735,658 B2
(45) Date of Patent: Aug. 22, 2023

(54) TUNNEL FIELD-EFFECT TRANSISTOR WITH REDUCED SUBTHRESHOLD SWING

(71) Applicant: International Business Machines Corporation, Armonk, NY (US)

(72) Inventors: Xin Miao, Slingerlands, NY (US); Chen Zhang, Guilderland, NY (US); Kangguo Cheng, Schenectady, NY (US); Wenyu Xu, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 374 days.

(21) Appl. No.: 16/743,637

(22) Filed: Jan. 15, 2020

(65) Prior Publication Data
US 2020/0152790 A1 May 14, 2020

Related U.S. Application Data

(62) Division of application No. 15/996,638, filed on Jun. 4, 2018, now Pat. No. 10,644,150.

(51) Int. Cl.
*H01L 29/78* (2006.01)
*H01L 21/02* (2006.01)
*H01L 21/306* (2006.01)
*H01L 29/06* (2006.01)
*H01L 29/08* (2006.01)
(Continued)

(52) U.S. Cl.
CPC ...... *H01L 29/7827* (2013.01); *H01L 21/0262* (2013.01); *H01L 21/02546* (2013.01);
(Continued)

(58) Field of Classification Search
CPC .......... H01L 29/7827; H01L 21/02546; H01L 21/0262; H01L 21/30621; H01L 29/0657;
(Continued)

(56) References Cited

U.S. PATENT DOCUMENTS 8,471,329 B2 6/2013 Bhuwalka et al.
8,796,733 B2 8/2014 Seabaugh et al.
(Continued)

OTHER PUBLICATIONS

R.N. Sajjad et al., "Trap Assisted Tunneling and its Effect on Subthreshold Swing of Tunnel Field Effect Transistors," IEEE Transactions on Electron Devices, Nov. 2016, pp. 4380-4387, vol. 63, No. 11.
(Continued)

*Primary Examiner* — Benjamin Tzu-Hung Liu
(74) *Attorney, Agent, or Firm* — Daniel Yeates; Ryan, Mason & Lewis, LLP

(57) ABSTRACT

A method for manufacturing a semiconductor device includes forming a source layer on a semiconductor substrate, forming a channel layer on the source layer, and forming a drain layer on the channel layer. The source, channel and drain layers are patterned into at least one fin, and a cap layer is formed on a lower portion of the at least one fin. The lower portion of the at least one fin includes the source layer and part of the channel layer. The method further includes forming a gate structure comprising a gate dielectric layer and a gate conductor on the at least one fin and on the cap layer. The cap layer is positioned between the lower portion of the at least one fin and the gate dielectric layer.

20 Claims, 4 Drawing Sheets

(51) Int. Cl.
*H01L 29/10* (2006.01)
*H01L 29/207* (2006.01)
*H01L 29/66* (2006.01)

(52) U.S. Cl.
CPC .... *H01L 21/30621* (2013.01); *H01L 29/0657* (2013.01); *H01L 29/0847* (2013.01); *H01L 29/1037* (2013.01); *H01L 29/207* (2013.01); *H01L 29/66522* (2013.01); *H01L 29/66666* (2013.01)

(58) Field of Classification Search
CPC ............ H01L 29/0847; H01L 29/1037; H01L 29/207; H01L 29/66522; H01L 29/66666; H01L 29/0676; H01L 29/068; H01L 29/205; H01L 29/66356; H01L 29/7391; B82Y 10/00
See application file for complete search history.

(56) References Cited

U.S. PATENT DOCUMENTS

| | | | |
|---|---|---|---|
| 9,397,199 | B1 | 7/2016 | Kwon et al. |
| 9,577,079 | B2 | 2/2017 | Gossner et al. |
| 9,613,955 | B1* | 4/2017 | Anderson ........... H01L 27/1203 |
| 9,640,636 | B1 | 5/2017 | Bentley et al. |
| 9,748,368 | B2 | 8/2017 | Mallik |
| 2011/0253981 | A1 | 10/2011 | Rooyackers et al. |
| 2013/0320427 | A1* | 12/2013 | Loh ..................... H01L 29/7391 |
| | | | 438/585 |
| 2014/0353593 | A1 | 12/2014 | Smets |
| 2017/0069753 | A1* | 3/2017 | Toh ....................... H01L 21/283 |
| 2017/0365663 | A1* | 12/2017 | Zhao ................... H01L 29/7391 |
| 2018/0190802 | A1* | 7/2018 | Yang ................. H01L 29/66356 |
| 2018/0294362 | A1* | 10/2018 | Fukui ....................... H01L 29/78 |
| 2021/0280700 | A1* | 9/2021 | Wernersson .......... H01L 29/775 |

OTHER PUBLICATIONS

A.C. Seabaugh et al., "Low-Voltage Tunnel Transistors for Beyond CMOS Logic," Proceedings of the IEEE, Dec. 2010, pp. 2095-2110, vol. 98, No. 12.

Q. Zhang et al., "Low-Subthreshold-Swing Tunnel Transistors," IEEE Electron Device Letters, Apr. 2006, pp. 297-300, vol. 27, No. 4.

List of IBM Patents or Patent Applications Treated as Related.

* cited by examiner

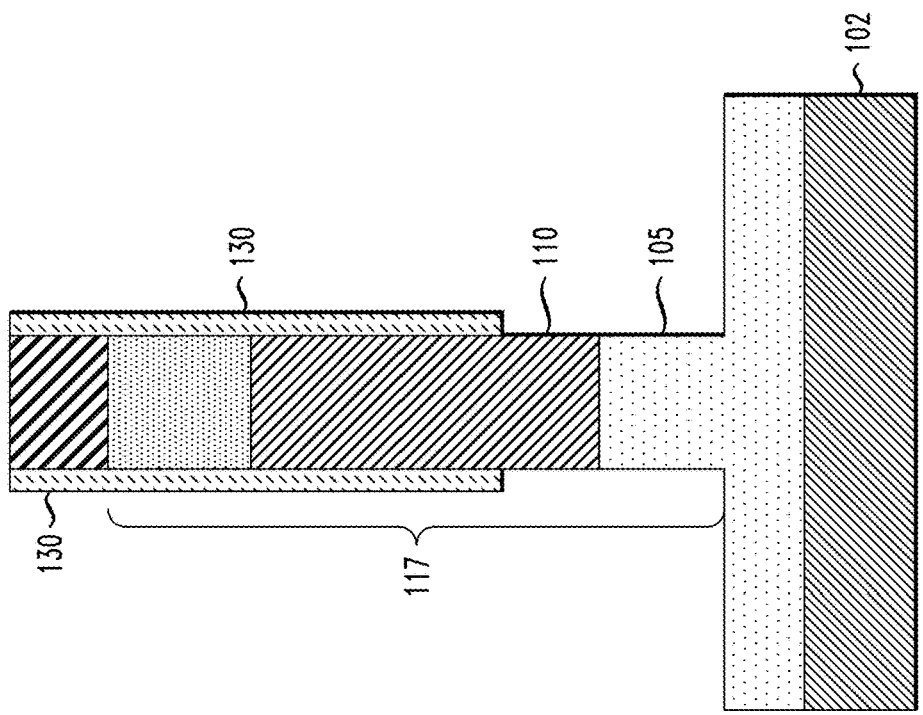
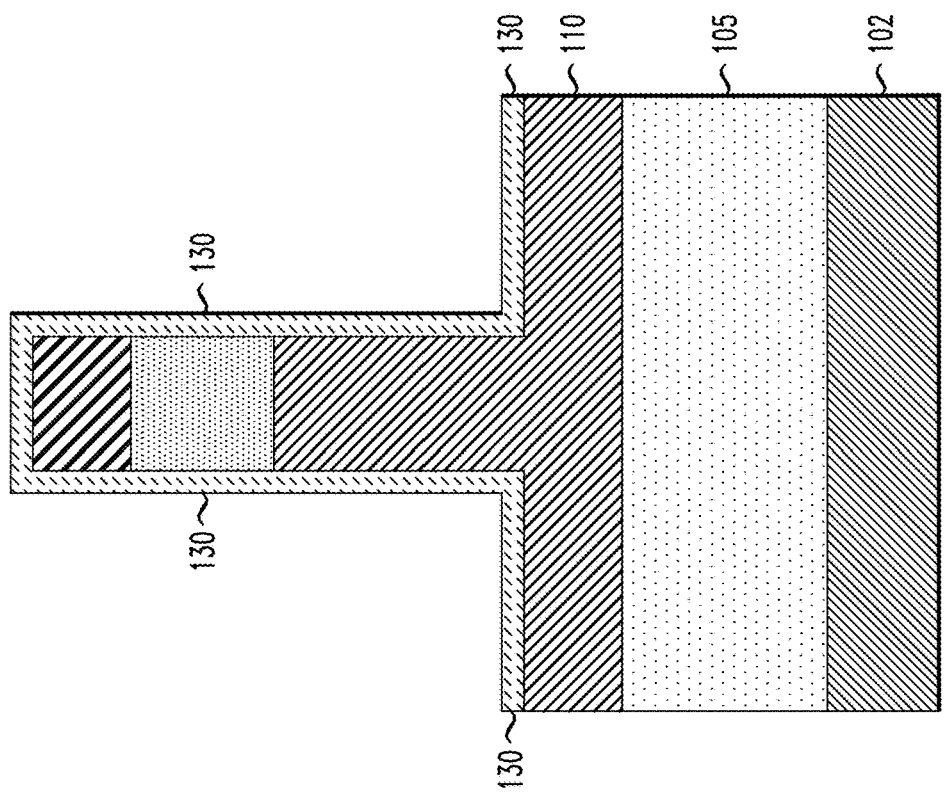

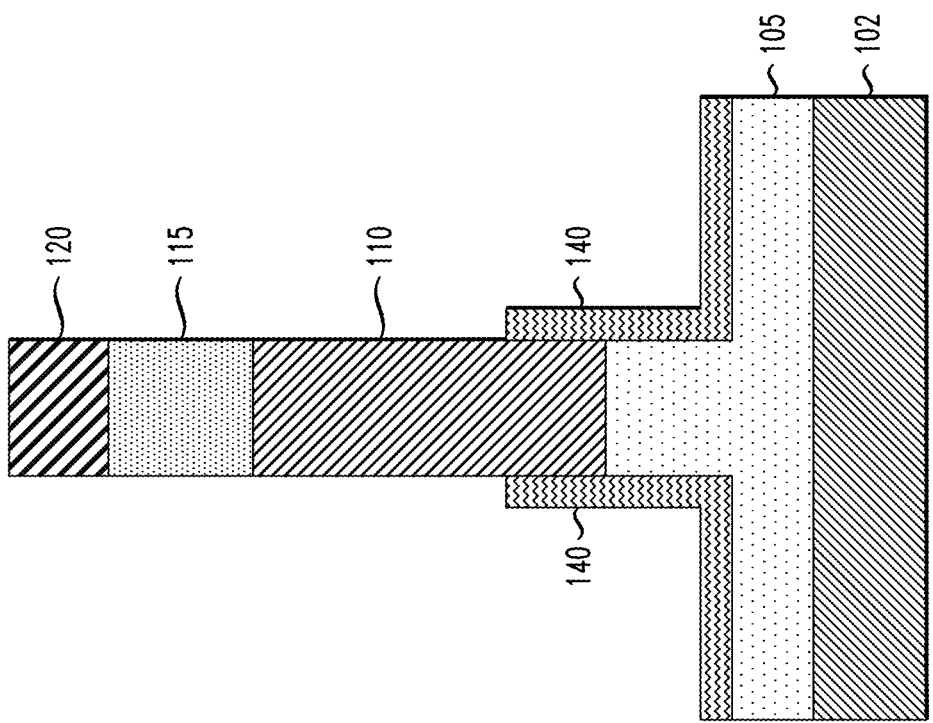

TUNNEL FIELD-EFFECT TRANSISTOR WITH REDUCED SUBTHRESHOLD SWING

BACKGROUND

Scaling down of complementary metal-oxide semiconductor (CMOS) transistors results in increased power consumption and short channel effects. Tunnel field-effect transistors (TFETs), which use a band-to-band tunneling (BTBT) mechanism for on-current, have been investigated as one of the more promising next-generation devices for low-power applications. TFETs are devices suited for low power applications because the current in a TFET is generated through tunneling. As a result, the subthreshold swing (SS) of a TFET can be lower than about 60 mV/decade (dec) at room temperature, which is the lower limit for subthreshold swing in a conventional metal-oxide-semiconductor field-effect transistor (MO SFET). Subthreshold swing refers to the gate voltage required to change drain current by one order of magnitude.

In practice, however, the subthreshold swing of a TFET is compromised by other parasitic carrier transport mechanics, such as trap assisted tunneling due to the overlap of a gate dielectric with the tunnel junction. Due to the overlap, interface traps at the tunnel junction cause a carrier from a source region to be trapped at an interface between a tunnel junction and a gate dielectric, resulting in parasitic current and increases in the subthreshold swing of the TFET. As a result, a subthreshold swing below 60 mV/dec is rarely obtained in a conventional TFET.

Accordingly, there is a need for an improved TFET and a method of manufacturing same which minimizes the impact of trap assisted tunneling.

SUMMARY

According to an exemplary embodiment of the present invention, a method for manufacturing a semiconductor device includes forming a source layer on a semiconductor substrate, forming a channel layer on the source layer, and forming a drain layer on the channel layer. The source, channel and drain layers are patterned into at least one fin, and a cap layer is formed on a lower portion of the at least one fin. The lower portion of the at least one fin includes the source layer and part of the channel layer. The method further includes forming a gate structure comprising a gate dielectric layer and a gate conductor on the at least one fin and on the cap layer. The cap layer is positioned between the lower portion of the at least one fin and the gate dielectric layer.

According to an exemplary embodiment of the present invention, a semiconductor device includes at least one fin on a semiconductor substrate. The at least one fin includes a channel layer stacked on a source layer and a drain layer stacked on the channel layer. A cap layer is disposed on a lower portion of the at least one fin. The lower portion of the at least one fin includes the source layer and part of the channel layer. A gate structure including a gate dielectric layer and a gate conductor is disposed on the at least one fin and on the cap layer. The cap layer is positioned between the lower portion of the at least one fin and the gate dielectric layer.

According to an exemplary embodiment of the present invention, a method for manufacturing a semiconductor device includes forming a source layer on a semiconductor substrate, forming a channel layer on the source layer, and forming a drain layer on the channel layer. The source, channel and drain layers are patterned into at least one fin, which extends perpendicularly with respect to a top surface of the semiconductor substrate. A cap layer is epitaxially grown on a lower portion of the at least one fin. The lower portion of the at least one fin includes the source layer and part of the channel layer. The method further includes forming a gate dielectric layer on the at least one fin and on the cap layer. The cap layer is positioned between the lower portion of the at least one fin and the gate dielectric layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 3 is a schematic cross-sectional view illustrating manufacturing of a semiconductor device and showing spacer formation, according to an embodiment of the invention.

FIG. 4 is a schematic cross-sectional view illustrating manufacturing of a semiconductor device and showing patterning of the channel layer and part of the source layer, according to an embodiment of the invention.

FIG. 5 is a schematic cross-sectional view illustrating manufacturing of a semiconductor device and showing formation of a cap layer, according to an embodiment of the invention.

FIG. 6 is a schematic cross-sectional view illustrating manufacturing of a semiconductor device and showing spacer removal, according to an embodiment of the invention.

DETAILED DESCRIPTION

Figure 2:
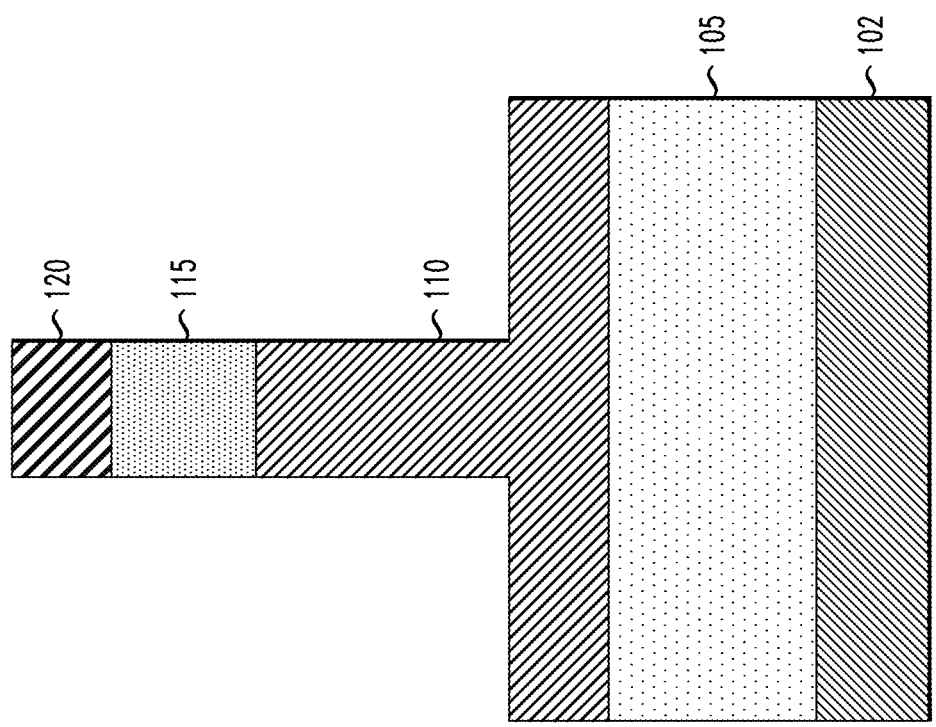
FIG. 2 is a schematic cross-sectional view illustrating manufacturing of a semiconductor device and showing patterning of the drain layer and part of the channel layer, according to an embodiment of the invention.

Exemplary embodiments of the invention will now be discussed in further detail with regard to semiconductor devices and methods of manufacturing same and, in particular, vertical transistor devices which minimize trap-assisted tunneling and reducing subthreshold swing of a TFET.

It is to be understood that the various layers and/or regions shown in the accompanying drawings are not drawn to scale, and that one or more layers and/or regions of a type commonly used in, for example, CMOS, field-effect transistor (FET), TFET, nanowire FET, nanosheet FET, fin field-effect transistor (FinFET), MOSFET, vertical FET and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, CMOSs, MOSFETs, TFETs, vertical FETs, nanowire FETs, nanosheet FETs and/or FinFETs. By way of non-limiting example, the semiconductor devices can include, but are not limited to FET, CMOS, MOSFET, TFET, vertical FET, nanowire FET, nanosheet FET and FinFET devices, and/or semiconductor devices that use FET, CMOS, MOSFET, TFET, vertical FET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention relate to a method and structure for forming a TFET in which the gate dielectric is separated from the tunnel junction by forming an epitaxial layer between the gate dielectric and the tunnel junction. The epitaxial layer is epitaxially grown and wraps around the tunnel junction before the deposition of the gate dielectric. In accordance with an embodiment of the present invention, the epitaxial layer has a much larger band gap than the channel and source materials. The presence of the epitaxial layer between the gate dielectric and the tunnel junction pushes interface traps away from the tunnel junction, thus minimizing the impact of the interface traps on tunnel current and reducing subthreshold swing of the TFET.

Embodiments of the present invention are for a TFET with minimized trap-assisted tunneling. A large bandgap cap layer (e.g., InP) is epitaxially grown to passivate a channel-bottom source junction, pushing interface traps to be between a gate dielectric layer and the large bandgap capping layer and away from the tunnel junction. As a result, trap-assisted tunneling is minimized.

Figure 1:
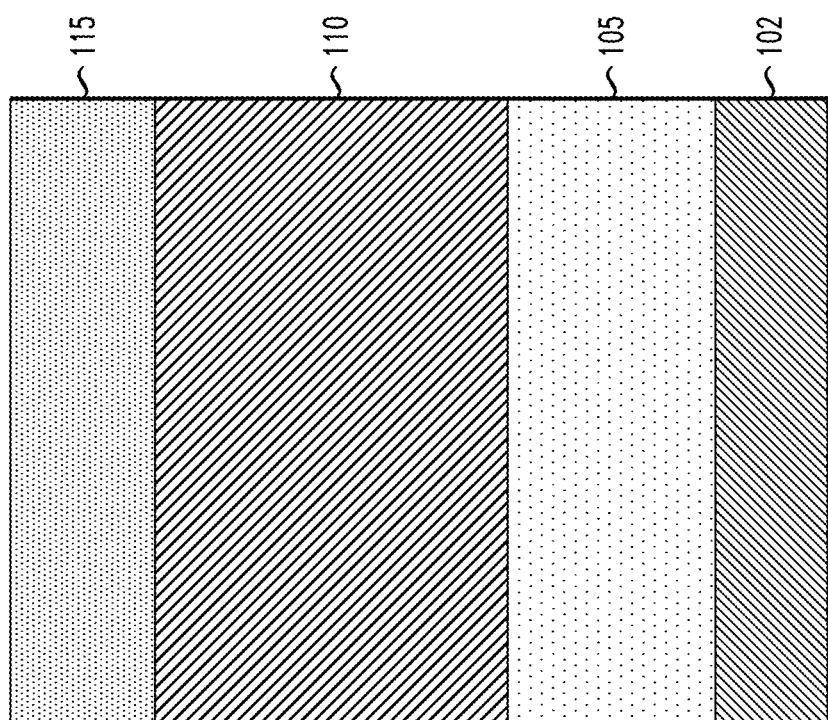
FIG. 1 is a schematic cross-sectional view illustrating manufacturing of a semiconductor device and showing formation of source, drain and channel regions on a semiconductor substrate, according to an embodiment of the invention.

FIG. 1 is a schematic cross-sectional view illustrating manufacturing of a semiconductor device and showing formation of source, drain and channel regions on a semiconductor substrate, according to an embodiment of the invention. Referring to FIG. 1, a semiconductor substrate 102 can include a semiconductor material such as, but not necessarily limited to, a III-V compound semiconductor obtained by combining group III elements, such as, for example, aluminum (Al), gallium (Ga), and indium (In), with group V elements, such as, for example, nitrogen (N), phosphorus (P), arsenic (As) and antimony (Sb). Some example III-V compound semiconductors include, but are not necessarily limited to, gallium arsenide (GaAs), indium phosphide (InP), gallium phosphide (GaP) and gallium nitride (GaN). Alternatively, the semiconductor substrate 102 can include, for example, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or other like semiconductor, and a buffer layer (not shown) including a III-V compound semiconductor, formed on the semiconductor substrate 102. In addition, multiple layers of the semiconductor materials can be used as the semiconductor material of the substrate.

A bottom source layer 105 is epitaxially grown on the substrate 102 or buffer layer, a channel layer 110 is epitaxially grown on the bottom source layer, and a top drain layer 115 is epitaxially grown on the channel layer 110. In accordance with an embodiment of the present invention, each of the bottom source, channel and top drain layers 105, 110 and 115 comprise a III-V compound semiconductor, such as, but not necessarily limited to, GaAs or indium gallium arsenide (InGaAs). The bottom source and top drain layers 105 and 115 are doped oppositely from each other (e.g., the bottom source layer 105 is p-type doped and the top drain layer 115 is n-type doped, or vice versa). For example, in the case of a p-type source/drain region, (e.g., P+), the region comprises carbon or zinc doped InGaAs, at concentrations of about $1E18/cm^3$ to about $1E21/cm^3$, and in the case of an n-type source/drain region, (e.g., N+), the region comprises silicon doped InGaAs, at concentrations of about 1E18/cm$^3$ to about 1E21/cm$^3$. According to an embodiment of the present invention, the channel layer 110 is undoped or unintentionally doped.

Approximate thicknesses (e.g., vertical heights) of the bottom source, channel and top drain layers 105, 110 and 115 are in the range of about 10 nm to about 100 nm, about 10 nm to about 50 nm and about 10 nm to about 50 nm, respectively.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a plasma-enhanced chemical vapor deposition (PECVD) apparatus. A number of different sources may be used for the epitaxial deposition of the in situ doped semiconductor material. In some embodiments, the gas source for the deposition of an epitaxially formed semiconductor material (e.g., an in situ doped semiconductor material) may include silicon (Si) deposited from silane, disilane, trisilane, tetrasilane, hexachlorodisilane, tetrachlorosilane, dichlorosilane, trichlorosilane, and combinations thereof. In other examples, when the epitaxially formed semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking. By "in-situ" it is meant that the dopant that dictates the conductivity type of the doped layer is introduced during the process step, e.g., epitaxial deposition, which forms the doped layer.

FIG. 2 is a schematic cross-sectional view illustrating manufacturing of a semiconductor device and showing patterning of the drain layer and part of the channel layer, according to an embodiment of the invention. Referring to FIG. 2, a hardmask 120 is formed on a part of the top drain layer 115 to cover portions of the drain, channel and source layers 115, 110 and 105 that will form an upper portion of a patterned fin or nanowire. The hardmask 120 can include, for example, silicon oxide (SiO$_x$) (x is, for example, 1.99, 2, 2.01), silicon nitride (SiN), boron nitride (BN), silicon boron nitride (SiBN), silicon boron carbon nitride (SiBCN) and/or silicon oxynitride (SiON), or other appropriate material.

An etching process, such as, but not necessarily limited to, reactive ion etching (RIE), is performed to remove exposed portions of the drain layer 115 and part of the channel layer 110 on sides where the drain and channel layers 115 and 110 are not protected by the hardmask 120. As can be seen, the exposed portions of the drain layer 115 and part of the channel layer 110 are removed. The portions of the drain layer 115 and the channel layer 110 are removed using any suitable etching technique in the art, including for example, anisotropic dry etching techniques such as RIE, ion beam etching and plasma etching. An etchant including, but not necessarily limited to, CH$_4$, H$_2$, Cl$_2$, SiC$_4$, SiF$_4$ and Ar, can be used. In some embodiments, suitable wet etching techniques may also be used.

FIG. 3 is a schematic cross-sectional view illustrating manufacturing of a semiconductor device and showing spacer formation, according to an embodiment of the invention. Referring to FIG. 3, spacer layers 130 are formed on top and on sides of the hardmask 120 and the patterned drain and channel layers 115, 110. The spacer layers 130 can be deposited using a deposition technique including, but not necessarily limited to, chemical vapor deposition (CVD), PECVD, radio-frequency CVD (RFCVD), physical vapor deposition (PVD), atomic layer deposition (ALD), molecular layer deposition (MLD), molecular beam deposition (MBD), pulsed laser deposition (PLD), and/or liquid source misted chemical deposition (LSMCD), sputtering, and/or plating. The spacer layers 130 can include a dielectric insulating material such as, for example, silicon oxide (SiOx), silicon nitride (SiN), silicon oxynitride (SiON), boron nitride (BN), silicon boron nitride (SiBN), silicon boron carbon nitride (SiBCN) and/or silicon oxynitride (SiON), or other appropriate material which can be selectively removed with respect to a material of the hardmask 120.

Prior to the processing explained in connection with FIG. 4, horizontal portions of the spacer layers 130 on a horizontal top surface of the hardmask 120 and on horizontal surfaces of the channel layer 110 are removed using a directional etch process, such as, for example, RIE, while portions of the spacer layers 130 on vertical sides of the hardmask 120 and the patterned drain and channel layers 115, 110 remain.

FIG. 4 is a schematic cross-sectional view illustrating manufacturing of a semiconductor device and showing patterning of the channel layer and part of the source layer, according to an embodiment of the invention. Referring to FIG. 4, following directional removal of the spacer layers 130 from the horizontal surfaces, an etching process, such as, but not necessarily limited to, RIE, is performed to remove exposed portions of the channel layer 115 and exposed portions of part of the source layer 105 on sides where the channel and source layers 110 and 105 are not protected by the hardmask 120 or the spacer layers 130. As can be seen, the exposed portions of the channel layer 110 and part of the source layer 105 from FIG. 3 are removed. Exposed portions of the channel layer 115 and the source layer 105 are vertically etched (e.g., recessed) using any suitable etching technique in the art, including for example, anisotropic dry etching techniques such as RIE, ion beam etching and plasma etching. Exposed portions of the channel and source layers 110 and 105 blocked from vertical etching by the spacer layers 130 are laterally etched to conform the critical dimension of a lower portion of the fin 117 not covered by the spacer layers 130 with the critical dimension of the upper portion of the fin 117 on which the spacer layers 130 are formed.

An etchant including, but not necessarily limited to, CH$_4$, H$_2$, Cl$_2$, SiCl$_4$, SiF$_4$ and Ar, can be used. In some embodiments, suitable wet etching techniques may also be used. As shown in FIG. 4, portions of the source layer 105 not under the hardmask 120 and extending over the top surface of the substrate 102 to the left and right of the patterned fin remain.

Excluding the spacer layers 130, the patterned fin 117 as shown in FIG. 4 includes the remaining drain and channel layers 115 and 110, and a patterned portion of the source layer 105 under the remaining drain and channel layers 115 and 110.

FIG. 5 is a schematic cross-sectional view illustrating manufacturing of a semiconductor device and showing formation of a cap layer, according to an embodiment of the invention. Referring to FIG. 5, a cap layer 140 is epitaxially grown on a bottom portion of the fin 117 not covered by the spacer layers 130, and on adjacent horizontal portions of the source layer 105 at sides of the fin 117. The spacer layers 130 prevent growth of the cap layer 140 on upper portions of the fin 117. In accordance with an embodiment of the present invention, the cap layer 140 includes a III-V compound semiconductor such as, but not necessarily limited to, InP, which has a larger bandgap than the material (e.g., InGaAs) of the channel and source layers 110, 105. As a result, a carrier from the source and channel layers 105, 110 does not enter into the cap layer 140, which functions as a dielectric to confine the carrier to the source and channel layers 105, 110. In accordance with an alternative embodiment, a channel and cap material combination can be a GaAs channel and an AlGaAs cap.

In a non-limiting illustrative example, the bandgap of an InP cap layer is about 1.34 eV, and the bandgap of channel and source layers 110, 105 including, for example, $In_{0.53}Ga_{0.47}As$, is about 0.75 eV. According to an embodiment of the present invention, the lattice constants of the InP cap layer and channel and source layers 110, 105 including, for example, $In_{0.53}Ga_{0.47}As$, are both 5.869 angstroms (Å). However, lattice match between the cap layer 140 and the channel and source layers 110, 105 is not necessarily required as long as the cap layer's thickness is below a critical thickness that no defects would form at the interface between the cap layer and the channel portion of the fin 117.

Figure 7:
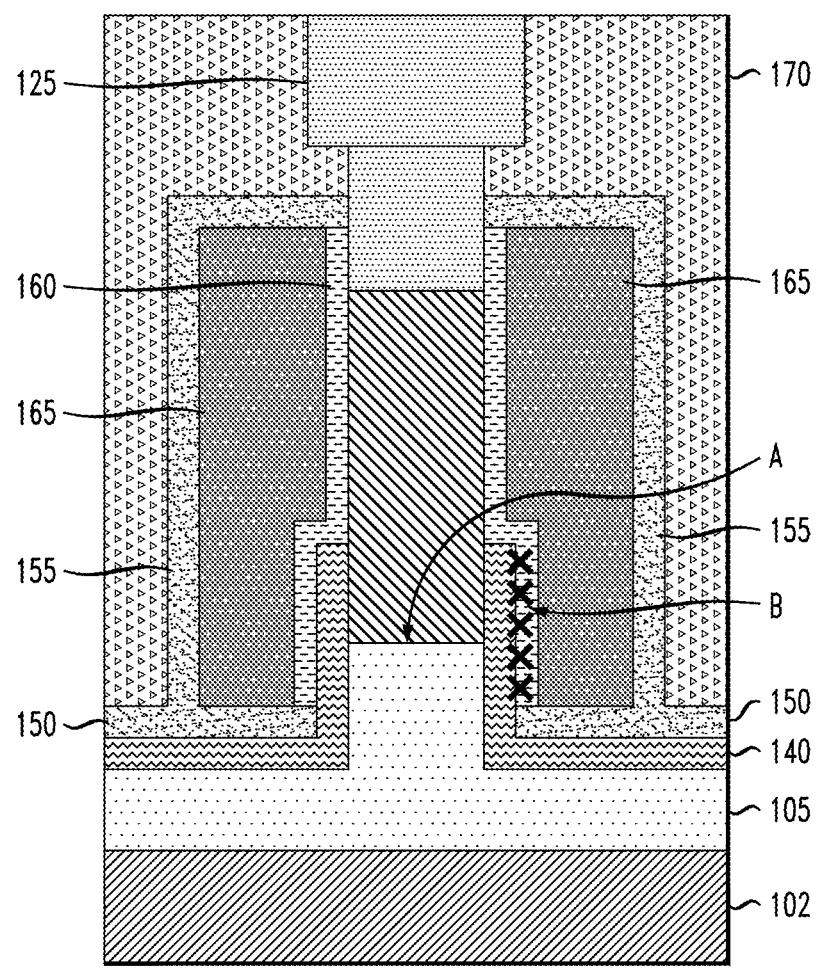
FIG. 7 is a schematic cross-sectional view illustrating manufacturing of a semiconductor device and showing further vertical transistor fabrication including formation of bottom and top spacers, a gate structure, an additional top drain region and an inter-level dielectric (ILD) layer, according to an embodiment of the invention.

The cap layer 140 passivates the channel/source junction (see arrow A in FIG. 7 illustrating the channel/source junction). In accordance with an embodiment of the present invention, a thickness of the cap layer 140 is in the range of about 1 nm to about 10 nm. A cap layer 140, which is thicker than the noted range, distances the gate too far away from the channel of the transistor, thereby degrading the control of the gate over the channel, and a cap layer 140 which is thinner than the noted range will cause the interface traps (See B in FIG. 7) to be too close to the tunnel junction, and may allow trap-assisted tunneling to occur.

FIG. 6 is a schematic cross-sectional view illustrating manufacturing of a semiconductor device and showing spacer removal, according to an embodiment of the invention. Referring to FIG. 6, the spacer layers 130 are removed after epitaxial growth of the cap layer 140. The spacer layers 130 are selectively removed with respect to the hardmask 120.

FIG. 7 is a schematic cross-sectional view illustrating manufacturing of a semiconductor device and showing further vertical transistor fabrication including formation of bottom and top spacers, a gate structure, an additional top drain region and an inter-level dielectric (ILD) layer, according to an embodiment of the invention. Referring to FIG. 7, vertical TFET fabrication continues by forming bottom and top spacers 150 and 155, a gate structure including a gate dielectric and gate conductor layers 160 and 165, an additional top drain region 125 and an inter-level dielectric (ILD) layer 170.

More specifically, bottom spacers 150 are formed on exposed horizontal or nearly horizontal surfaces. Spacer material includes, but is not necessarily limited to, plasma enhanced chemical vapor deposition (PECVD)-type, high aspect ratio process (HARP)-type or high density plasma (HDP)-type low-K dielectric layers, including, but not necessarily limited to, silicon boron nitride (SiBN), silicon boron carbon nitride (SiBCN), silicon oxycarbonitride (SiOCN), SiN or $SiO_x$. The bottom spacers 150 are deposited using, for example, directional deposition techniques, including, but not necessarily limited to high density plasma (HDP) deposition and gas cluster ion beam (GCIB) deposition. The directional deposition deposits the spacer material preferably on the exposed horizontal or nearly horizontal surfaces, but not on lateral sidewalls. In another embodiment, an isotropic etching (for example, wet etching) can be performed after bottom spacer deposition to remove unwanted bottom spacer material on vertical sidewalls. A mask layer (for example, organic planarization layer) can be deposited and recessed before the isotropic etching to protect the bottom spacer material on the horizontal surface of the bottom source layer 105.

The gate structures include gate conductor layers 165 and gate dielectric layers 160. The dielectric layers 160 include, for example, a high-K material including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide). Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate conductor layers 165 include, for example, a work-function metal (WFM) layer, including but not necessarily limited to, for a p-type FET (pFET), titanium nitride (TiN), tantalum nitride (TaN) or ruthenium (Ru), and for an n-type FET (nFET), TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. The gate conductor layers 165 may further include a metal layer, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate structures are deposited on the spacers 150, on and around the fins 117 and on the cap layers 140 using, for example, deposition techniques including, but not limited to, CVD, PECVD, RFCVD, PVD, ALD, MLD, MBD, PLD0, LSMCD, sputtering, and/or plating. The gate structures, including the gate dielectric and gate conductor layers 160 and 165 are recessed to a lower height above the substrate 102. According to an embodiment, recessing is performed by a wet or dry etching process that is selective with respect to materials of the fin 117 and the hardmask 120.

Top spacer layers 155 are formed on the recessed gate structures. Similar to the lower spacer layers 150, spacer material for the top spacer layers 155 includes, but is not necessarily limited to, PECVD-type, HARP-type or HDP-type low-K dielectric layers, including, but not limited to, SiBN, SiBCN, SiOCN, SiN or $SiO_x$.

The hardmask 120 is selectively removed, using for example, a selective etch process. The selective etch process can include, for example, a wet etch process containing phosphoric acid at a temperature around 80° C. Optionally, an additional top drain region 125 can be epitaxially grown from the drain region 115, and comprises the same or similar material and doping as the drain region 115. The additional top drain region 125 enlarges the critical dimension of the top drain region, which can further reduce resistance.

Referring to FIG. 7, an ILD layer 170 is deposited to fill in the area around the gate structure including the gate dielectric and gate conductor layers 160 and 165, the spacer layers 150 and 155 and the drain regions 115, 125. The ILD layer 170 can include, for example, $SiO_x$, low-temperature oxide (LTO), high-temperature oxide (HTO), or flowable oxide (FOX), and is deposited using a deposition process, such as, for example, CVD, PECVD, PVD, ALD, MLD, MBD, PLD, and/or LSMCD. The deposited layer is planarized using a planarization process, such as, for example, chemical mechanical planarization (CMP). Further downstream processing can be performed to form electrically conductive contact regions to gate structures and source/drain regions.

As can be seen in FIG. 7, the source-channel tunnel junction A is covered by the epitaxially grown cap layer 140, which physically distances the gate dielectric 160 and consequently, the interface traps B (as shown by x's) away from tunnel junction A, thereby minimizing trap-assisted tunneling and reducing subthreshold swing of the TFET.

Although embodiments of the present invention are illustrated and explained in connection with one fin, the embodiments of the present invention are not necessarily limited thereto, and the processes described herein may be simultaneously performed on more than one fin on a substrate.

Although embodiments of the present invention are illustrated and explained in connection with a vertical TFET, where current travels vertically through a channel region from a bottom source region to a top drain region, the embodiments of the present invention are not necessarily limited thereto, and may be applied to horizontal TFET devices.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:

1. A semiconductor device, comprising:
    at least one fin on a semiconductor substrate, the at least one fin comprising a channel layer stacked on top of a source layer and a drain layer stacked on top of the channel layer;
    a cap layer disposed on a lower portion of the at least one fin comprising the source layer and part of the channel layer; and
    a gate structure comprising a gate dielectric layer and a gate conductor disposed on the at least one fin and on the cap layer;
    wherein the cap layer is positioned between the lower portion of the at least one fin and the gate dielectric layer; and
    wherein the cap layer extends perpendicularly with respect to a top surface of the semiconductor substrate along a lateral side of the at least one fin to an uppermost height below the top of the channel layer;
    wherein a first portion of the gate dielectric layer is disposed on a side of the cap layer, and a second portion of the gate dielectric layer is disposed on a part of the lateral side of the at least one fin without the cap layer positioned between the part of the lateral side of the at least one fin and the second portion of the gate dielectric layer; and
    wherein the lattice constants of the cap layer, of the channel layer and of the source layer are the same.

2. The semiconductor device according to claim 1, wherein the cap layer comprises a III-V compound semiconductor material.

3. The semiconductor device according to claim 2, wherein the source, channel and drain layers each comprise a III-V compound semiconductor material different from the III-V compound semiconductor material of the cap layer.

4. The semiconductor device according to claim 3, wherein the source, channel and drain layers each comprise one of gallium arsenide (GaAs) and indium gallium arsenide (InGaAs).

5. The semiconductor device according to claim 1, wherein the cap layer has a larger band gap than a band gap of the source and channel layers.

6. The semiconductor device according to claim 1, where the source and drain layers have opposite doping types from each other.

7. The semiconductor device according to claim 1, wherein the at least one fin extends perpendicularly with respect to the top surface of the semiconductor substrate.

8. The semiconductor device according to claim 1, wherein a thickness of the cap layer is in the range of about 1 nm to about 10 nm.

9. The semiconductor device according to claim 1, wherein the cap layer covers a tunnel junction between the source layer and the channel layer.

10. The semiconductor device according to claim 1, wherein a third portion of the gate dielectric layer is disposed on a top surface of the cap layer at the uppermost height.

11. A semiconductor device, comprising:
    at least one fin on a semiconductor substrate, the at least one fin comprising a channel layer stacked on a source layer and a drain layer stacked on the channel layer;
    a cap layer disposed on a lower portion of the at least one fin comprising the source layer and part of the channel layer; and
    a gate structure comprising a gate dielectric layer and a gate conductor disposed on the at least one fin and on the cap layer;
    wherein the cap layer is positioned between the lower portion of the at least one fin and the gate dielectric layer, and extends along a lateral side of the at least one fin to an uppermost height below a top of the channel layer;
    wherein the lattice constants of the cap layer, of the channel layer and of the source layer are the same; and
    wherein the cap layer comprises one of indium phosphide (InP) and aluminum gallium arsenide (AlGaAs).

12. A semiconductor device, comprising:
    a channel layer stacked on top of a source layer and a drain layer stacked on top of the channel layer;
    a cap layer disposed on the source layer and part of the channel layer; and
    a gate structure comprising a gate dielectric layer and a gate conductor disposed on the source, channel and drain layers and on the cap layer;
    wherein the cap layer is positioned between the gate dielectric layer and the source layer and part of the channel layer; and wherein the cap layer extends along lateral sides of the source layer and the channel layer to an uppermost height below the top of the channel layer;

wherein a first portion of the gate dielectric layer is disposed on a side of the cap layer, and a second portion of the gate dielectric layer is disposed on a part of the lateral side of the channel layer without the cap layer positioned between the part of the lateral side of the channel layer and the second portion of the gate dielectric layer; and wherein the cap layer comprises a III-V compound semiconductor material.

13. The semiconductor device according to claim 12, wherein the source, channel and drain layers each comprise a III-V compound semiconductor material different from the III-V compound semiconductor material of the cap layer.

14. The semiconductor device according to claim 13, wherein the source, channel and drain layers each comprise one of gallium arsenide (GaAs) and indium gallium arsenide (InGaAs).

15. The semiconductor device according to claim 12, wherein the cap layer has a larger band gap than a band gap of the source and channel layers.

16. The semiconductor device according to claim 12, where the source and drain layers have opposite doping types from each other.

17. The semiconductor device according to claim 12, wherein the cap layer covers a tunnel junction between the source layer and the channel layer.

18. The semiconductor device according to claim 12, wherein the lattice constants of the cap layer, of the channel layer and of the source layer are the same.

19. The semiconductor device according to claim 12, wherein a third portion of the gate dielectric layer is disposed on a top surface of the cap layer at the uppermost height.

20. A semiconductor device, comprising:

a channel layer stacked on a source layer and a drain layer stacked on the channel layer;

a cap layer disposed on the source layer and part of the channel layer; and a gate structure comprising a gate dielectric layer and a gate conductor disposed on the source, channel and drain layers and on the cap layer;

wherein the cap layer is positioned between the gate dielectric layer and the source layer and part of the channel layer; and wherein the cap layer extends along lateral sides of the source layer and the channel layer to an uppermost height below a top of the channel layer and comprises one of indium phosphide (InP) and aluminum gallium arsenide (AlGaAs); and wherein the lattice constants of the cap layer, of the channel layer and of the source layer are the same.

* * * * *